(12) United States Patent
Guo et al.

(10) Patent No.: US 11,848,059 B2
(45) Date of Patent: Dec. 19, 2023

(54) TECHNIQUES FOR ERASING THE MEMORY CELLS OF EDGE WORD LINES

(71) Applicant: SanDisk Technologies LLC, Addison, TX (US)

(72) Inventors: Jiacen Guo, Cupertino, CA (US); Xiang Yang, Santa Clara, CA (US); Abhijith Prakash, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/529,722

(22) Filed: Nov. 18, 2021

(65) Prior Publication Data

US 2023/0154550 A1    May 18, 2023

(51) Int. Cl.
| G11C 16/34 | (2006.01) |
| G11C 16/04 | (2006.01) |
| G11C 16/28 | (2006.01) |
| G11C 16/08 | (2006.01) |
| G11C 16/16 | (2006.01) |

(52) U.S. Cl.
CPC ...... *G11C 16/3445* (2013.01); *G11C 16/0433* (2013.01); *G11C 16/08* (2013.01); *G11C 16/16* (2013.01); *G11C 16/28* (2013.01); *G11C 16/3404* (2013.01)

(58) Field of Classification Search
CPC . G11C 16/3445; G11C 16/0433; G11C 16/08; G11C 16/16; G11C 16/28; G11C 16/3404; G11C 16/345; G11C 16/344
See application file for complete search history.

(56) References Cited

U.S. PATENT DOCUMENTS

| 8,339,861 | B2 * | 12/2012 | Chang | G11C 16/14 |
| | | | | 365/185.11 |
| 9,449,698 | B1 * | 9/2016 | Paudel | G11C 16/3445 |
| 11,127,467 | B1 * | 9/2021 | Wang | G11C 16/349 |
| 2017/0125117 | A1 * | 5/2017 | Tseng | G11C 16/10 |
| 2018/0075919 | A1 * | 3/2018 | Pang | G11C 16/349 |
| 2021/0272980 | A1 * | 9/2021 | Kashima | H01L 27/1157 |

* cited by examiner

*Primary Examiner* — Kretelia Graham
(74) *Attorney, Agent, or Firm* — DICKINSON WRIGHT PLLC; Steven C. Hurles

(57) ABSTRACT

A method of erasing memory cells in a memory device is provided. The method includes grouping a plurality of word lines into a first group, which does not include edge word lines, and a second group, which does include edge word lines. An erase operation is performed on the memory cells of the first and second groups until erase-verify of the memory cells of the first group passes. It is then determined if further erase of the memory cells of the second group is necessary. In response to it being determined that the additional erase operation is necessary, an additional erase operation is performed on at least some of the memory cells of the second group until erase-verify of the memory cells of the second group passes.

18 Claims, 18 Drawing Sheets

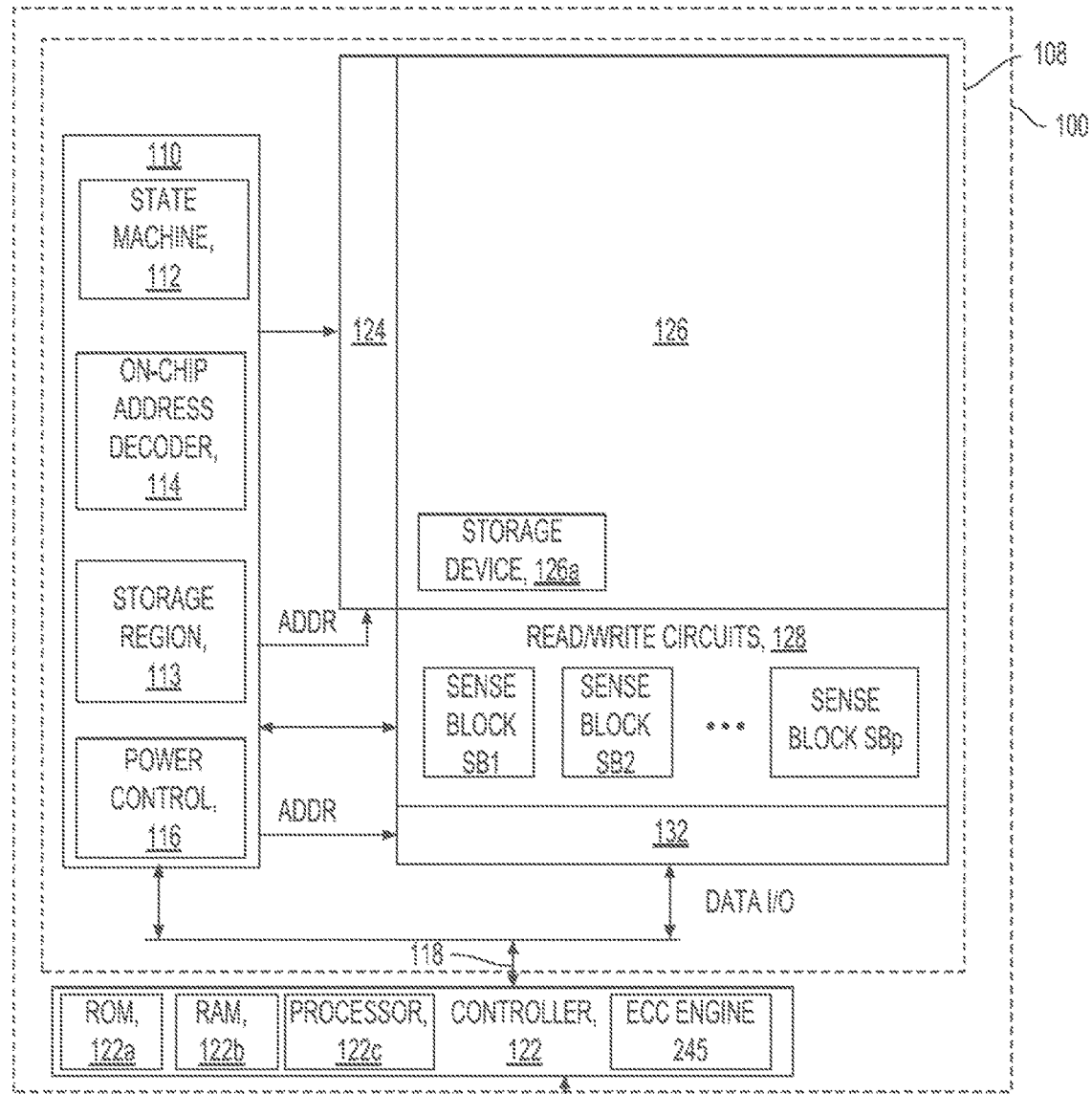
*FIG. 1A - Prior Art*
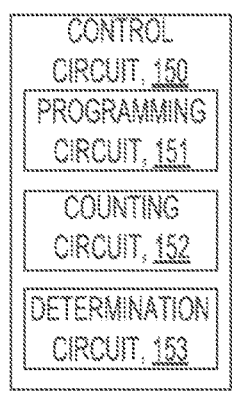
*FIG. 1B - Prior Art*

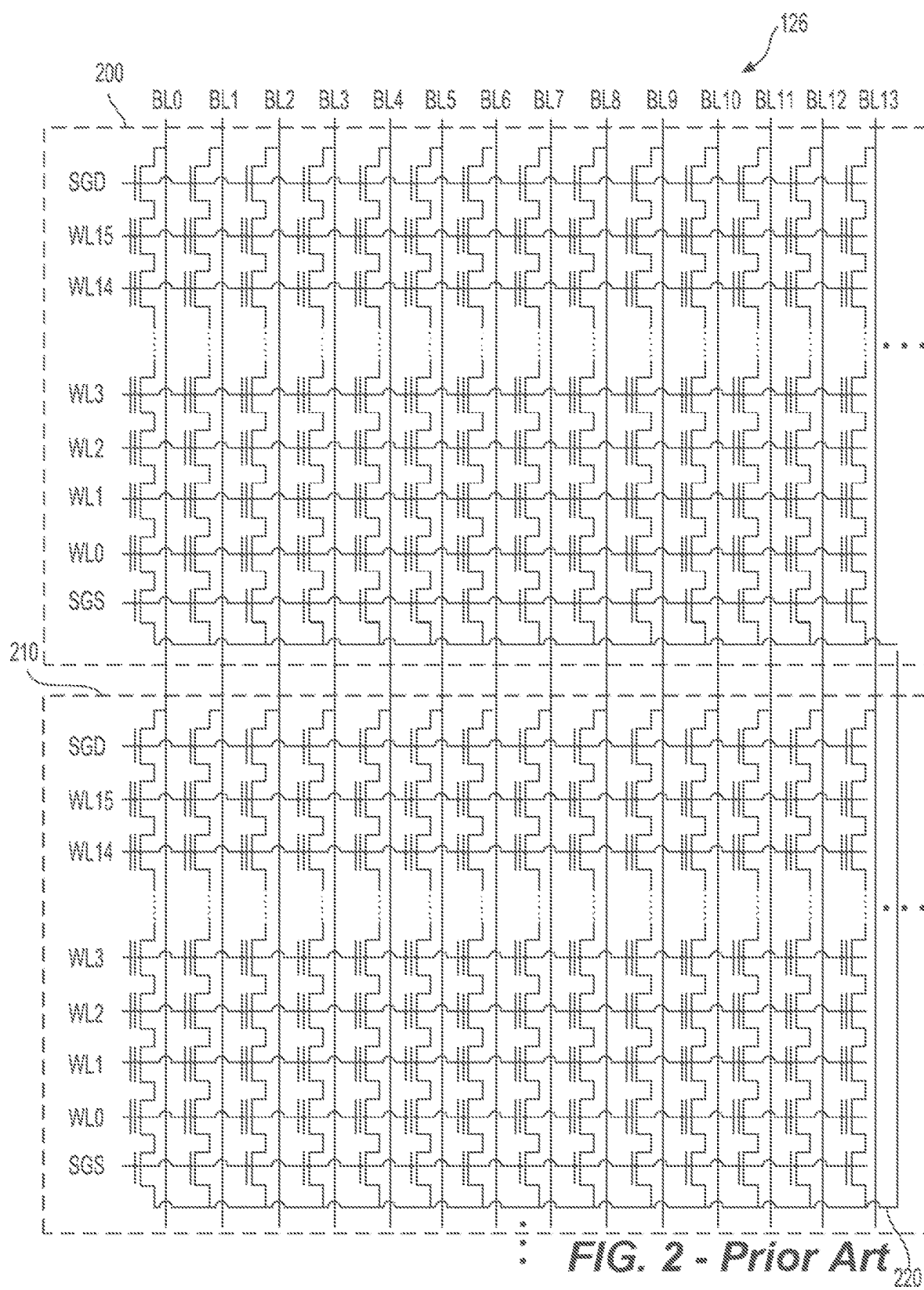
FIG. 2 - Prior Art

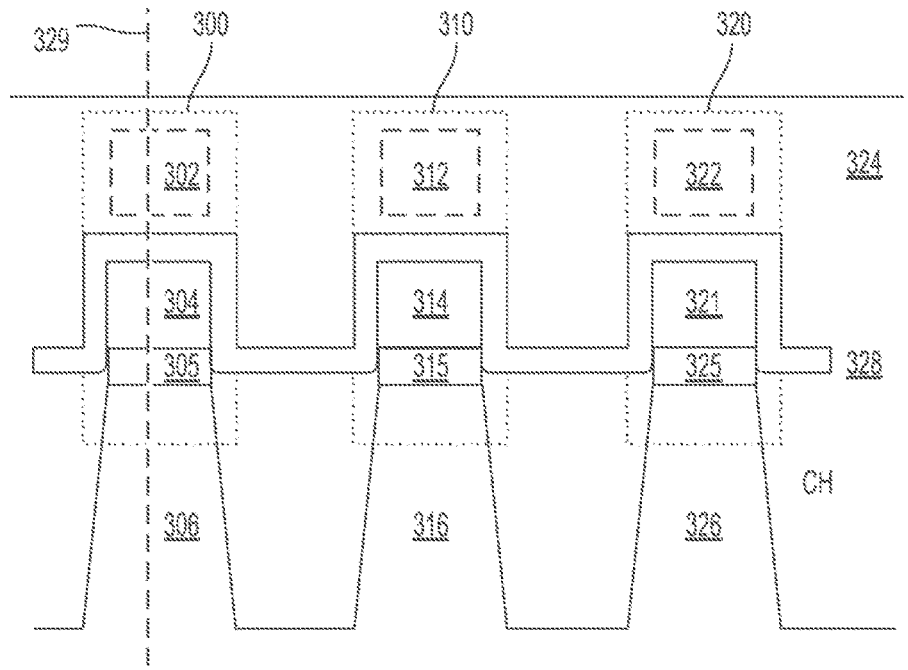
FIG. 3A - Prior Art
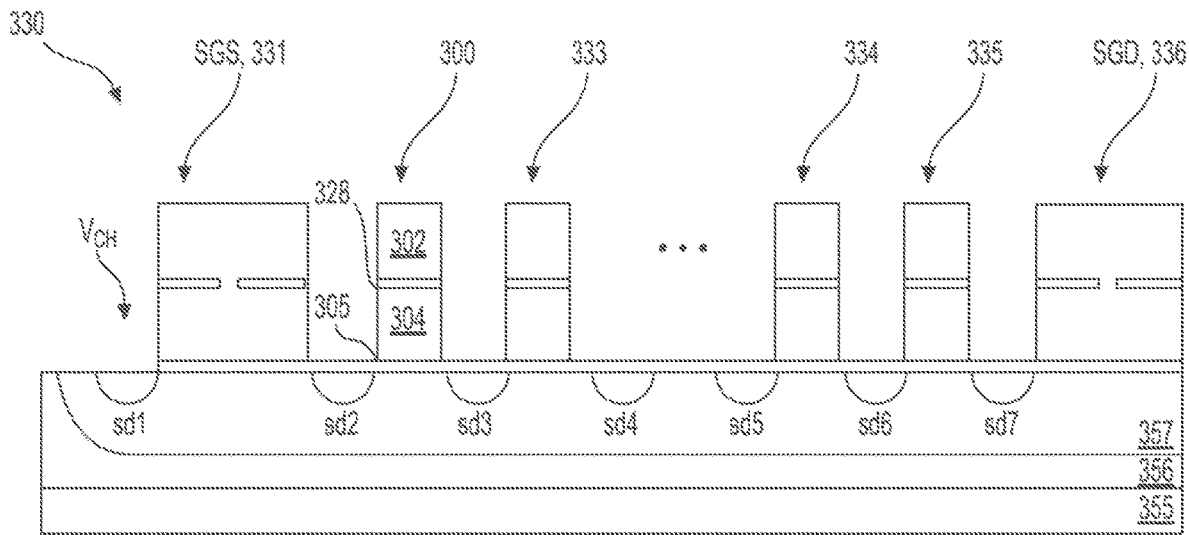
FIG. 3B - Prior Art

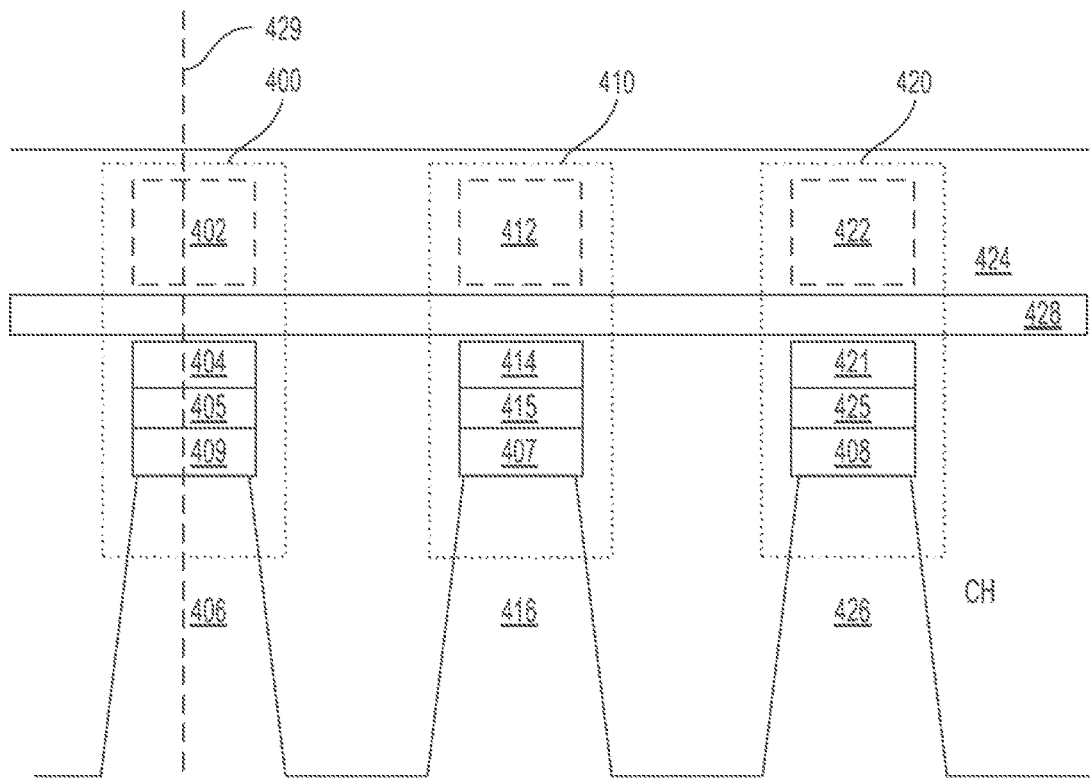
FIG. 4A - Prior Art
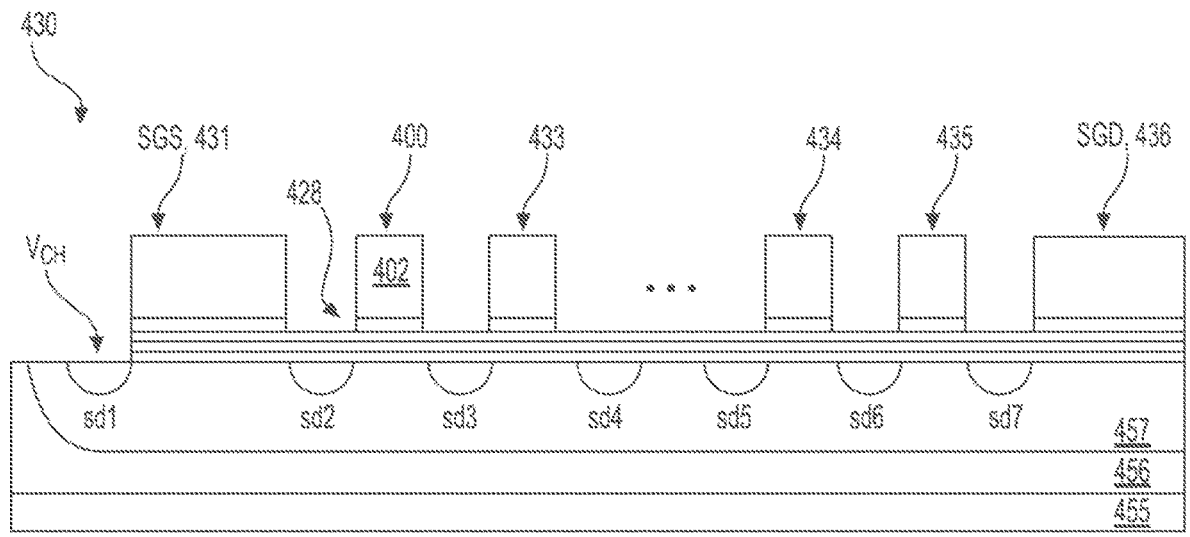
FIG. 4B - Prior Art

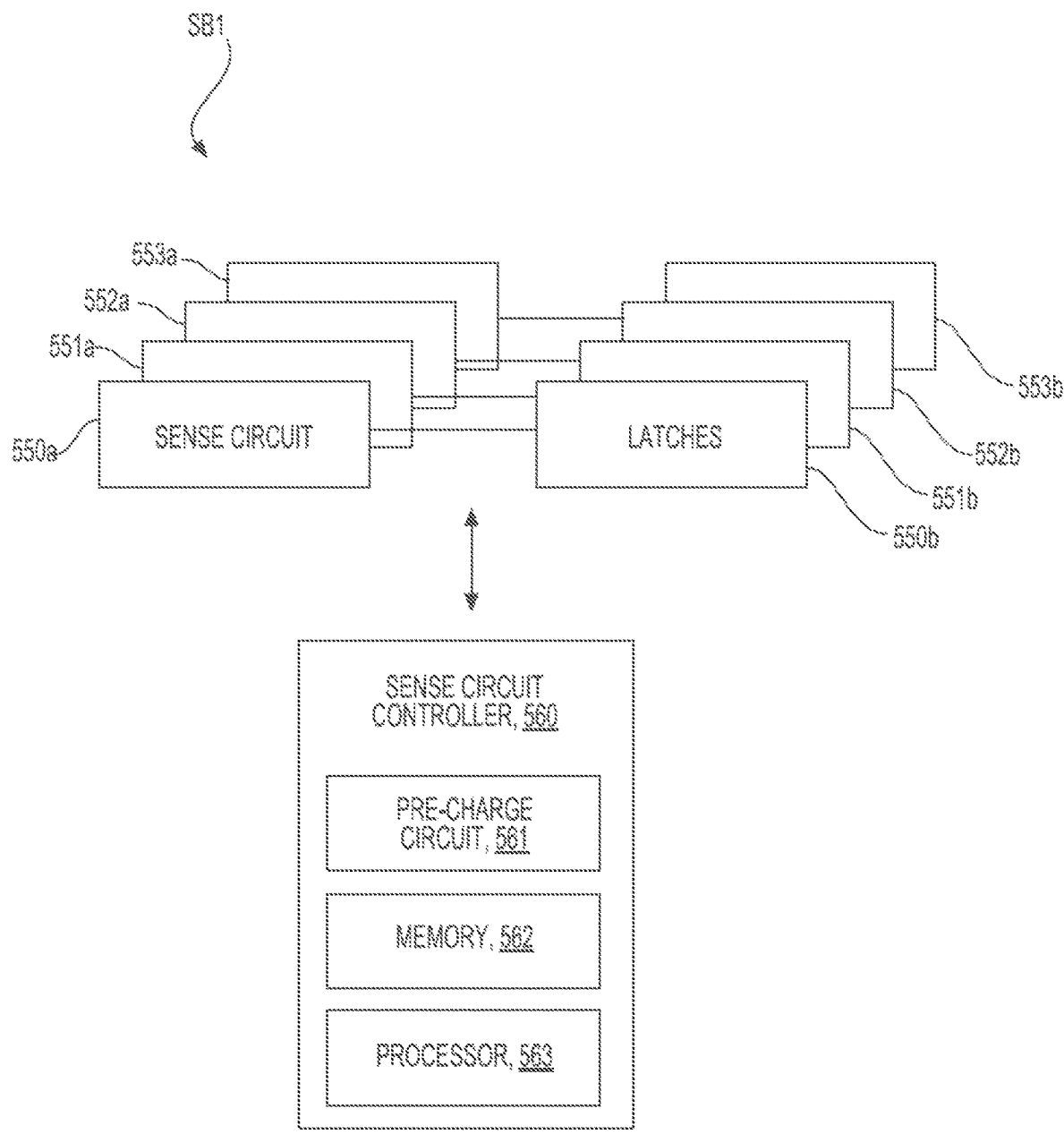
FIG. 5 - Prior Art

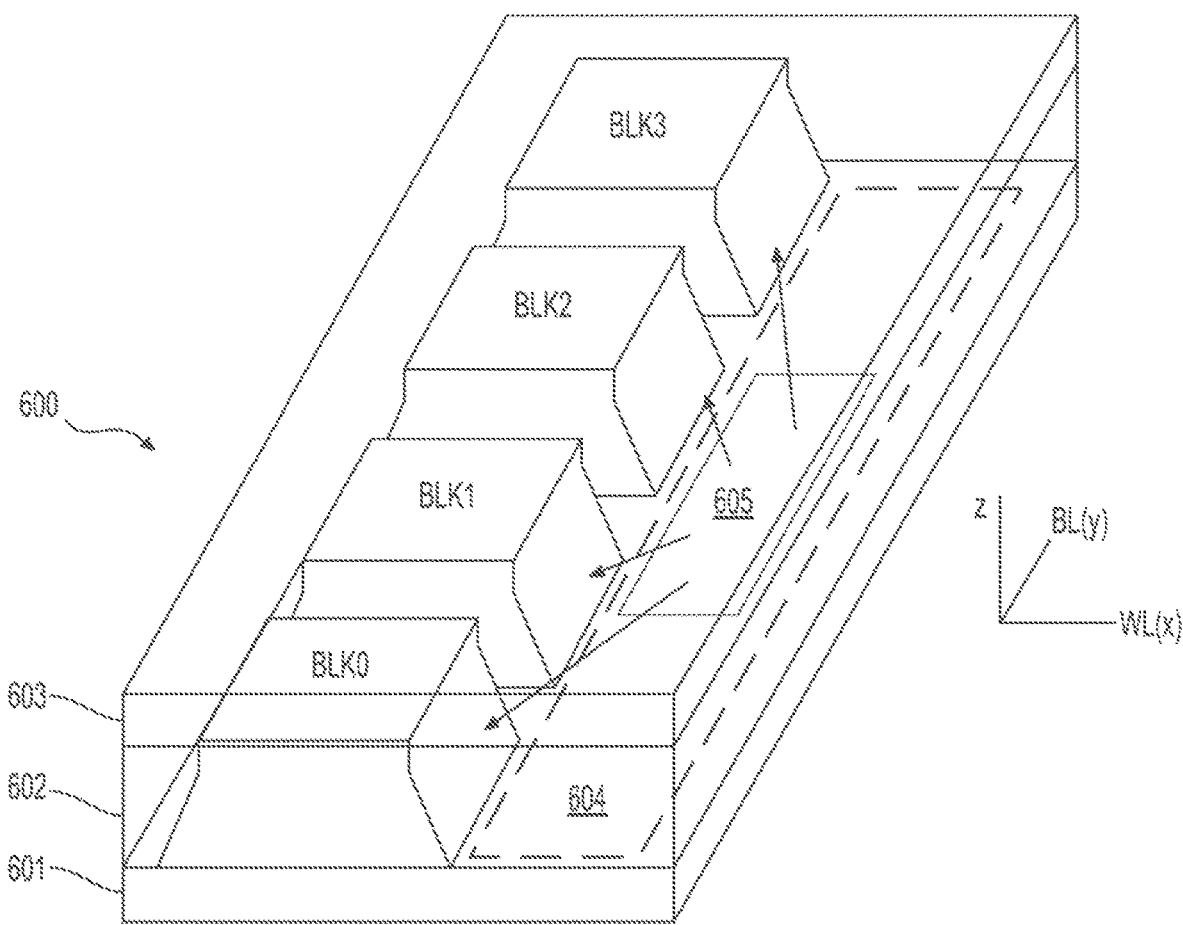
FIG. 6A - Prior Art

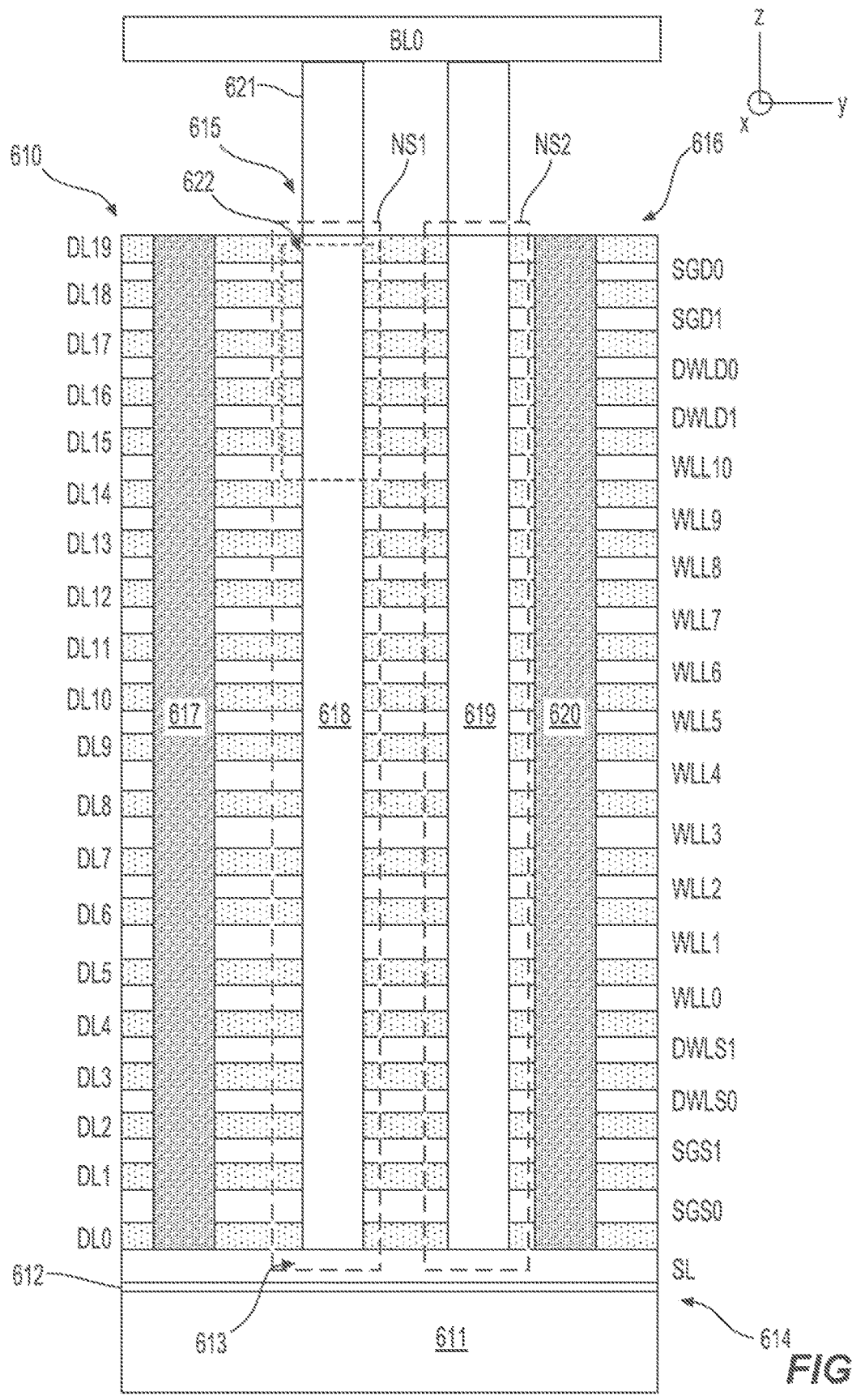
FIG. 6B - Prior Art

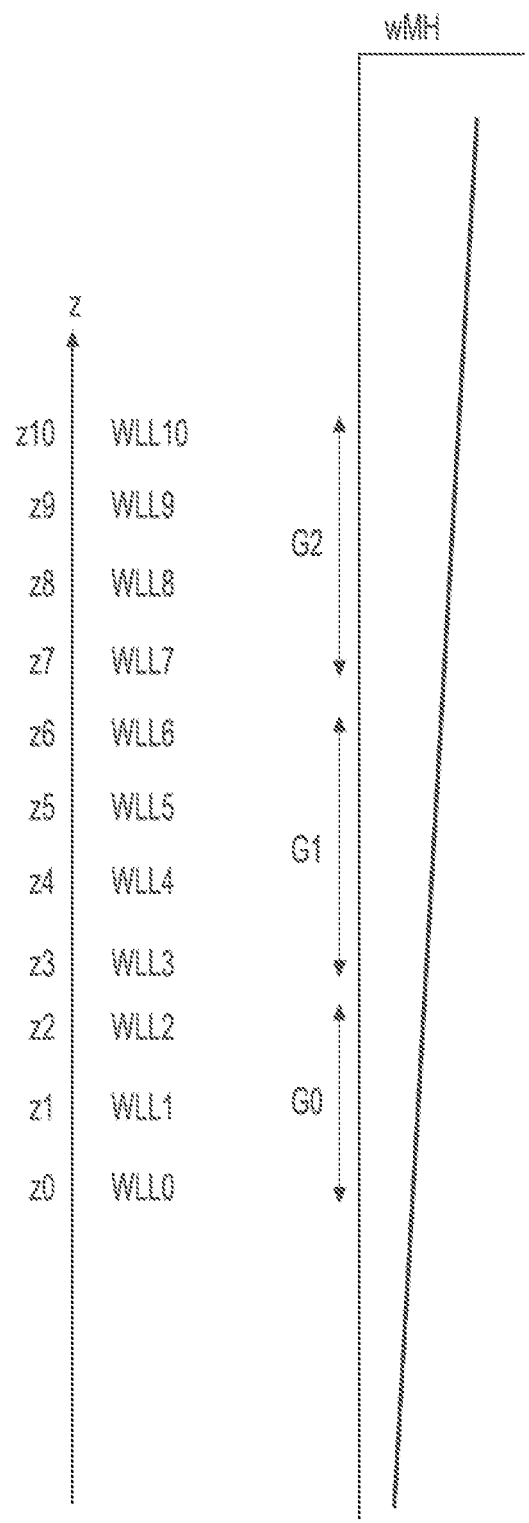
FIG. 6C - Prior Art

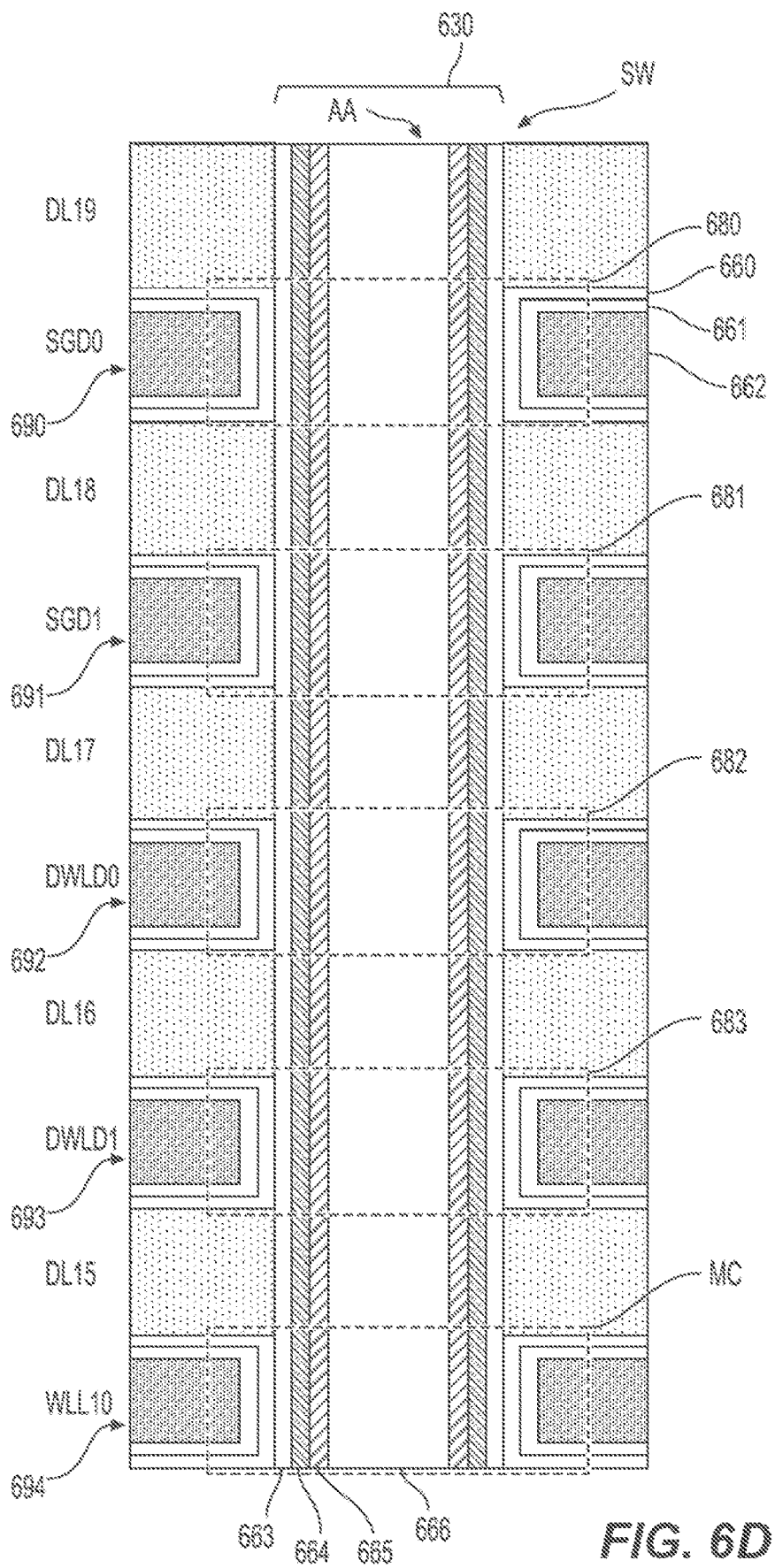
FIG. 6D - Prior Art

TECHNIQUES FOR ERASING THE MEMORY CELLS OF EDGE WORD LINES

FIELD

This application relates to non-volatile memory apparatuses and the operation of non-volatile memory apparatuses.

BACKGROUND

This section provides background information related to the technology associated with the present disclosure and, as such, is not necessarily prior art.

Memory devices of the 3D stacked NAND architecture typically include an array of memory cells which are arranged in a plurality of word lines. The memory cells are disposed along strings, which each include at least one source-side select gate (SGS) and at least one drain-side select gate (SGD). Some of the word lines are dummy word lines not meant for storing data. The dummy word lines are located adjacent the SGS and the SGD. The other word lines are data word lines. The data word lines that are immediately adjacent the dummy word lines are sometimes called "edge word lines." In some such memory devices, during an erase operation, the edge word lines may not erase as deeply as the other data word lines, which can lead to programming issues. One solution to address this shallow erase issue in the edge word lines is to apply an additional erase pulse to the memory cells. However, this could cause the memory cells of the other data word lines (i.e., the data word lines that are not edge word lines) to be over-erased, which may also have unintended reliability consequences.

SUMMARY

One aspect of the present disclosure is related to a memory device that includes a memory block with a plurality of memory cells arranged in a plurality of word lines. The plurality of word lines includes at least one edge word line. The memory device also includes a controller, which is in communication with the plurality of memory cells. The controller is configured to group the word lines into a first group, which does not include the at least one edge word line, and a second group, which does include the at least one edge word line. During an erase operation, the controller is configured to perform an erase operation on the memory cells of the first and second groups until erase-verify of the memory cells of the first group passes. The controller determine if further erase of the memory cells of the second group is necessary. In response to a determination that further erase of the memory cells of the second group is necessary, the controller is configured to perform an additional erase operation on at least some of the memory cells of the second group until erase-verify of the memory cells of the second group passes.

According to another aspect of the present disclosure, the memory block includes at least one stack with at least one SGD, at least one SGS and the plurality of word lines includes at least one dummy word line and a plurality of data word lines, and the at least one edge word line is at least one of the plurality of data word lines that is adjacent at least one dummy word line.

According to yet another aspect of the present disclosure, at least one SHE trench extends through a portion of the memory block such that at least one SGD or at least one SGS is semi-circular in shape.

According to still another aspect of the present disclosure, during the erase operation, the controller is further configured to determine a first count that is a number of the memory cells of the first group that have threshold voltages above an erase verify voltage and determine a second count that is a number of memory cells of the second group that have threshold voltages above the erase verify voltage. The controller is then configured to compare a difference between the first count and the second count to a predetermined threshold. In response to the difference being greater than the predetermined threshold, the controller is configured to conduct an additional erase operation on at least one word line of the first group.

According to a further aspect of the present disclosure, the first group of word lines does not include any edge word lines of the memory block, and the second group of word lines includes all edge word lines.

According to yet a further aspect of the present disclosure, during the additional erase operation, the controller is configured to inhibit at least one word line from further erase.

According to still a further aspect of the present disclosure, the at least one word line that the additional erase operation is conducted on includes only edge word line(s).

According to another aspect of the present disclosure, the additional erase operation includes at least one erase-verify iteration that includes an erase pulse which is applied to the control gate o at least one word line of the second group and at least one verify pulse.

According to yet another aspect of the present disclosure, the at least one erase-verify iteration includes multiple erase-verify, and the controller is configured to incrementally increase a voltage of the erase pulse between erase-verify iterations.

Another aspect of the present disclosure is related to a method of erasing a plurality of memory cells in a memory device. The method includes the step of preparing a memory block that includes a plurality of memory cells arranged in a plurality of word lines. The plurality of word lines including at least one edge word line. The method continues with the step of grouping the word lines into a first group, which does not include the at least one edge word line, and a second group, which does include the at least one edge word line. The method proceeds with the step of performing an erase operation on the memory cells of the first and second groups until erase-verify of the memory cells of the first group passes. The method continues with the step of determining if further erase of the memory cells of the second group is necessary. In response to it being determined that the additional erase operation is necessary, the method proceeds with performing an additional erase operation on at least some of the memory cells of the second group until erase-verify of the memory cells of the second group passes.

According to another aspect of the present disclosure, the memory block includes at least one stack with at least one SGD and SGS. The plurality of word lines includes at least one dummy word line and a plurality of data word lines. The at least one edge word line is at least one of the plurality of data word lines that is adjacent at least one dummy word line.

According to yet another aspect of the present disclosure, at least one SHE trench extends through a portion of the memory block such that at least one SGD or at least one SGS is semi-circular in shape.

According to still another aspect of the present disclosure, the method further includes the step of determining a first count that is a number of the memory cells of the first group that have threshold voltages above an erase verify voltage.

The method proceeds with the step of determining a second count that is a number of memory cells of the second group that have threshold voltages above the erase verify voltage. The method continues with the step of comparing a difference between the first count and the second count to a predetermined threshold. In response to the difference being greater than the predetermined threshold, the method proceeds with the step of conducting an additional erase operation on at least one word line of the first group.

According to a further aspect of the present disclosure, the first group of word lines does not include any edge word lines of the memory block and wherein the second group of word lines includes all edge word lines.

According to yet a further aspect of the present disclosure, during the additional erase operation, the method further includes the step of inhibiting at least one word line from further erase.

According to still a further aspect of the present disclosure, the at least one word line that the additional erase operation is conducted on includes only edge word line(s).

According to another aspect of the present disclosure, the additional erase operation includes at least one erase-verify iteration that includes an erase pulse that is applied to at the control gate of at least one word line of the second group and at least one verify pulse.

According to yet another aspect of the present disclosure, the at least one erase-verify iteration includes multiple erase-verify iterations, and a voltage of the erase pulse is increased between erase-verify iterations.

Yet another aspect of the present disclosure is related to an apparatus that includes a memory block with a plurality of memory cells, which are arranged in a plurality of word lines. The plurality of word lines includes at least one edge word line. The apparatus further includes an erasing means in communication with the plurality of memory cells for erasing the plurality of memory cells. The erasing means is configured to group the word lines into a first group, which does not include the at least one edge word line, and a second group, which does include the at least one edge word line. The erase means is further configured to perform an erase operation on the memory cells of the first and second groups until erase-verify of the memory cells of the first group passes. The erase means is further configured to determine if further erase of the memory cells of the second group is necessary. In response to it being determined that further erase of the memory cells of the second group is necessary, the erase means is further configured to perform an additional erase operation on at least some of the memory cells of the second group until erase-verify of the memory cells of the second group passes.

According to another aspect of the present disclosure, at least one SHE trench extends through a portion of the memory block such that at least one SGD or at least one SGS is semi-circular in shape.

DRAWINGS

The drawings described herein are for illustrative purposes only of selected embodiments and not all possible implementations, and are not intended to limit the scope of the present disclosure.

FIG. 1A is a block diagram of an example memory device according to aspects of the disclosure;

FIG. 1B is a block diagram of an example control circuit that includes a programming circuit, a counting circuit, and a determination circuit according to aspects of the disclosure;

FIG. 2 illustrates schematic views of three types of memory architectures utilizing staggered memory strings according to aspects of the disclosure;

FIG. 3A illustrates a cross-sectional view of example floating gate memory cells in NAND strings according to aspects of the disclosure;

FIG. 3B illustrates a cross-sectional view along a contact line shown in FIG. 3A according to aspects of the disclosure;

FIGS. 4A and 4B illustrate non-volatile memory in which a charge-trapping memory cell uses a non-conductive dielectric material in place of a conductive floating gate to store charge in a non-volatile manner according to aspects of the disclosure;

FIG. 5 illustrates an example block diagram of the sense block of FIG. 1 according to aspects of the disclosure;

FIG. 6A is a perspective view of a set of blocks in an example three-dimensional configuration of the memory array of FIG. 1 according to aspects of the disclosure;

FIG. 6B illustrates an example cross-sectional view of a portion of one of the blocks of FIG. 6A according to aspects of the disclosure;

FIG. 6C illustrates a plot of memory hole diameter in the stack of FIG. 6B according to aspects of the disclosure;

FIG. 6D illustrates a close-up view of the region of the stack of FIG. 6B according to aspects of the disclosure;

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 7A:
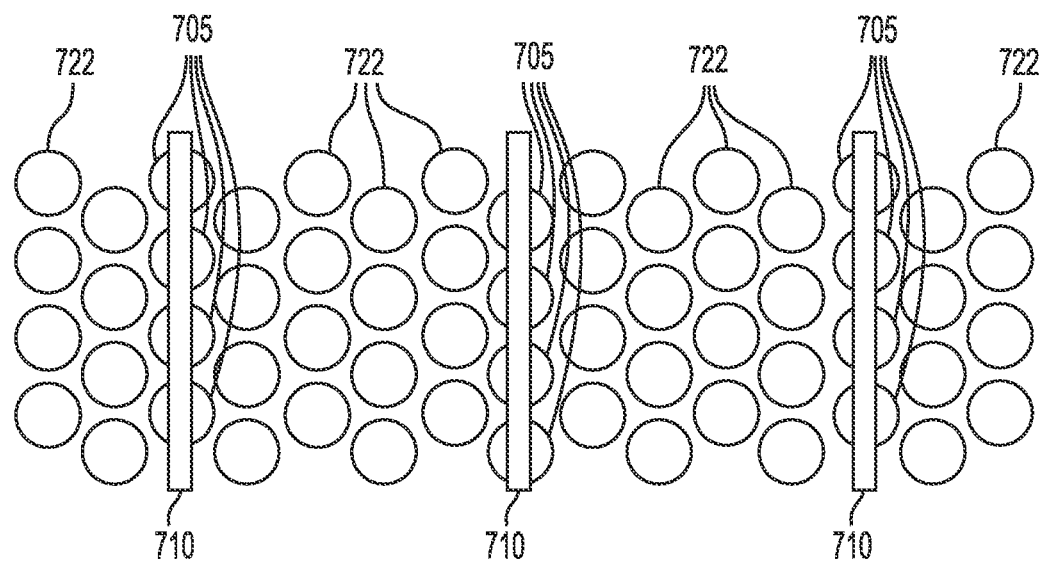
FIG. 7A illustrates a schematic plan view of a memory array with a plurality of memory holes according to aspects of the disclosure.

In the following description, details are set forth to provide an understanding of the present disclosure. In some instances, certain circuits, structures and techniques have not been described or shown in detail in order not to obscure the disclosure.

As discussed in further detail below, the present disclosure is related to erase techniques that are able to more uniformly erase the memory cells of a plurality of word lines, including the memory cells of at least one edge word line, without over-erasing the memory cells of the non-edge word lines. During an erase operation, the word lines being erased are divided into two groups (Group 1 and Group 2), one of which includes the edge word lines and the other of which does not. All word lines are then erased in at least one erase-verify iteration which includes at least one erase pulse and at least one verify pulse.

In one embodiment, the number of memory cells of Group 1, which does not include the edge word lines, that do not pass erase-verify is counted to define a first count N1. The number of memory cells of Group 2, which does include the edge word lines, that do not pass erase-verify is counted to define a second count N2. A difference between the second and first counts (N2−N1) is then compared to a predetermined threshold, and if this difference is greater than the predetermined threshold, an additional erase operation is performed on only the edge word lines while inhibiting erase in the other data word lines.

In another embodiment, all of the memory cells are erased until the memory cells of Group 1, which does not include the edge word lines, passes erase-verify. If the memory cells of Group 2 have not passed erase-verify, then at least one additional erase-verify iteration is performed on Group 2 while further erase of the Group 1 memory cells is inhibited until the Group 2 memory cells pass erase-verify.

These erase techniques provide for a very uniform erase across the data word lines, including the edge data word lines, in both memory devices that do have shallow erase issues and those that do not. Moreover, these erase techniques may be especially advantageous in memory devices which have semi-circular SGDs as such memory devices may be especially vulnerable to shallow erase in their edge word lines, as discussed in further detail below.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, ... which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a data memory cell MC is programmed, electrons are stored in a portion of the charge-trapping layer 663 which is associated with the memory cell MC. These electrons are drawn into the charge-trapping layer 663 from the channel 665, and through the tunneling layer 664. The Vth of a memory cell MC is increased in proportion to the amount of stored charge. During an erase operation, the electrons return to the channel 665.

Each of the memory holes 630 can be filled with a plurality of annular layers comprising a blocking oxide layer, a charge-trapping layer 663, a tunneling layer 664 and a channel layer 665. A core region of each of the memory holes 630 is filled with a body material, and the plurality of annular layers are between the core region and the word line in each of the memory holes 630.

The NAND string can be considered to have a floating body channel 665 because the length of the channel 665 is not formed on a substrate. Further, the NAND string is provided by a plurality of word line layers above one another in a stack, and separated from one another by dielectric layers.

FIG. 7A shows a schematic plan view of a memory array 700 with a plurality of memory holes 722, which can be vertical memory cell strands as described herein, and a plurality of dummy holes 705, which need not one complete memory structures. A shallow trench etch or shallow etching feature (SHE) 710 extends through a plurality of word lines (for example, five) but not fully through the chip to electrically isolate adjacent strings from one another. The SHE extends directly through a group of aligned dummy holes 705, thereby preventing those dummy holes 705 from storing data or otherwise being functional memory cells.

Figure 7B:
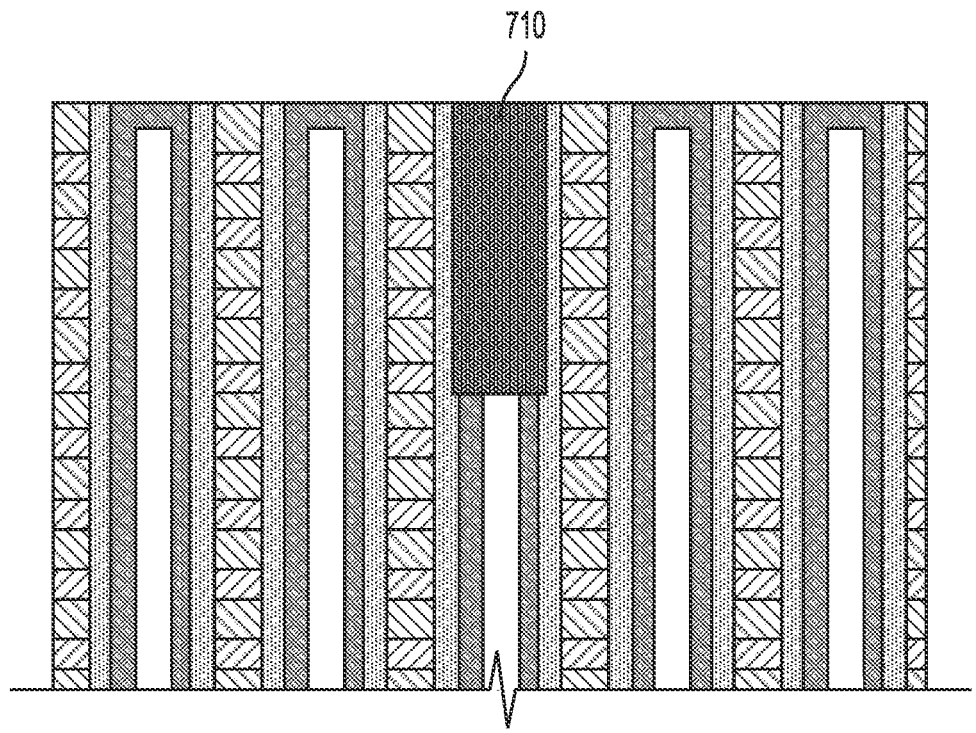
FIG. 7B illustrates a cross-sectional view of the memory array according to aspects of the disclosure.
Figure 8A:
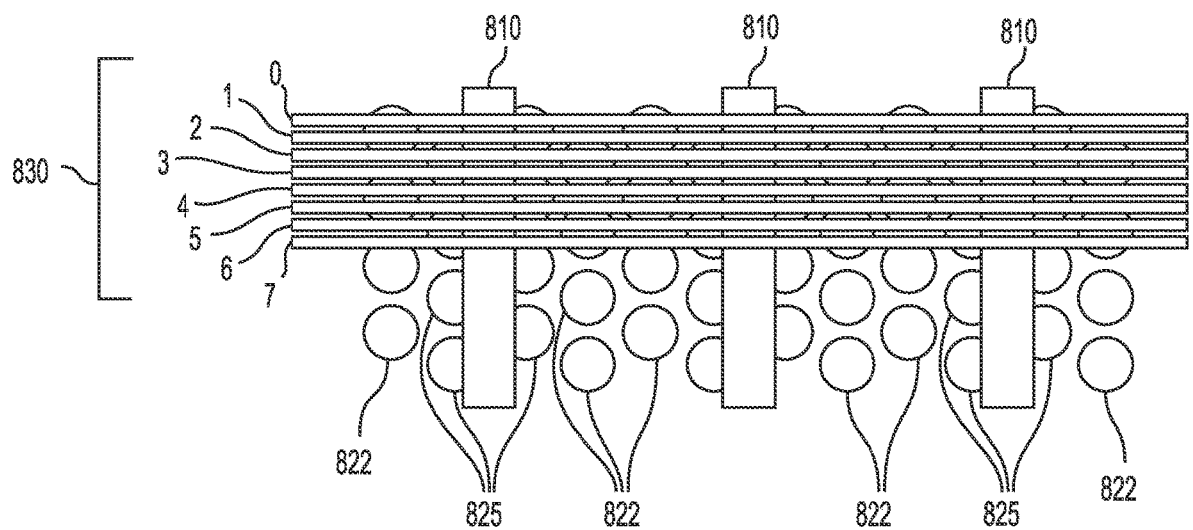
FIGS. 8A and 8B illustrate an alternate memory structure with no dummy holes according to aspects of the disclosure.
Figure 8B:
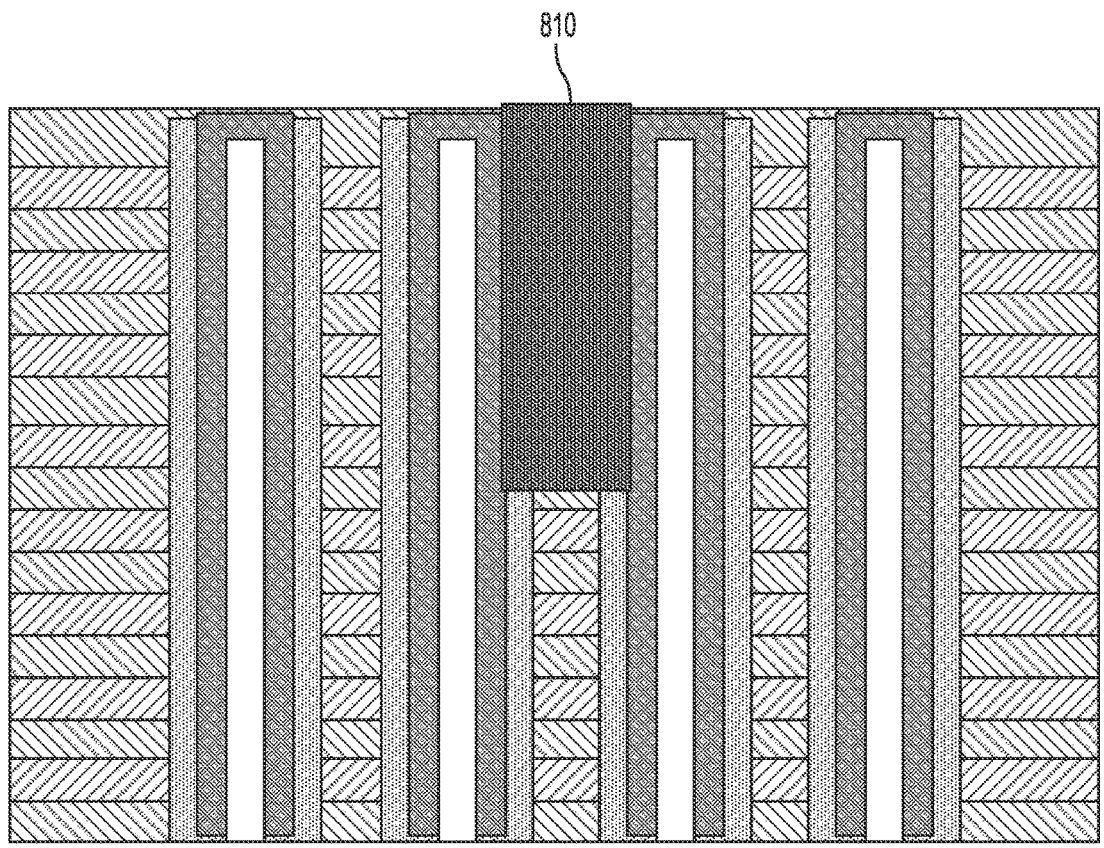

Referring now to FIGS. 8A and 8B, there are no dummy holes. Unlike the memory structure 700 of FIGS. 7A and 7B, the SHE 810 is located in a gap between two adjacent rows of memory cells 825 and overlaps with memory holes 825, thereby creating a working strand that has a trench etched down into a side of at least the SGD switch at the top of the working memory strand, here shown as memory holes 825. This configuration substantially improves memory density as all of the memory holes 822, 825 are functional, i.e., fewer memory holes are wasted.

Unlike the fully circular memory holes 822, the memory holes 825 and the SGD switches that are partially cut by the SHE 810 have a semi-circular shape, which can either be a half circle or can be more or less than a half-circle. In some cases, the memory holes 825 and SGD switches can be less than half circles on one side of the SHE 810 and more than half circles on the other side of the SHE 810.

The memory holes 822, 825 are connected with a plurality of bit lines 830 (labeled as bit lines 0-7 in FIG. 8A). For ease of illustration, only eight bit lines 830 have been shown. The bit lines 830 extend over above the memory holes and are connected to select memory holes via connection points. The memory holes in each string area also connected at one end to an SGD switch and at the other end to an SGS switch. The SHE trench 810 may be etched into a portion of the SGD switch or even deeper.

Figure 9:
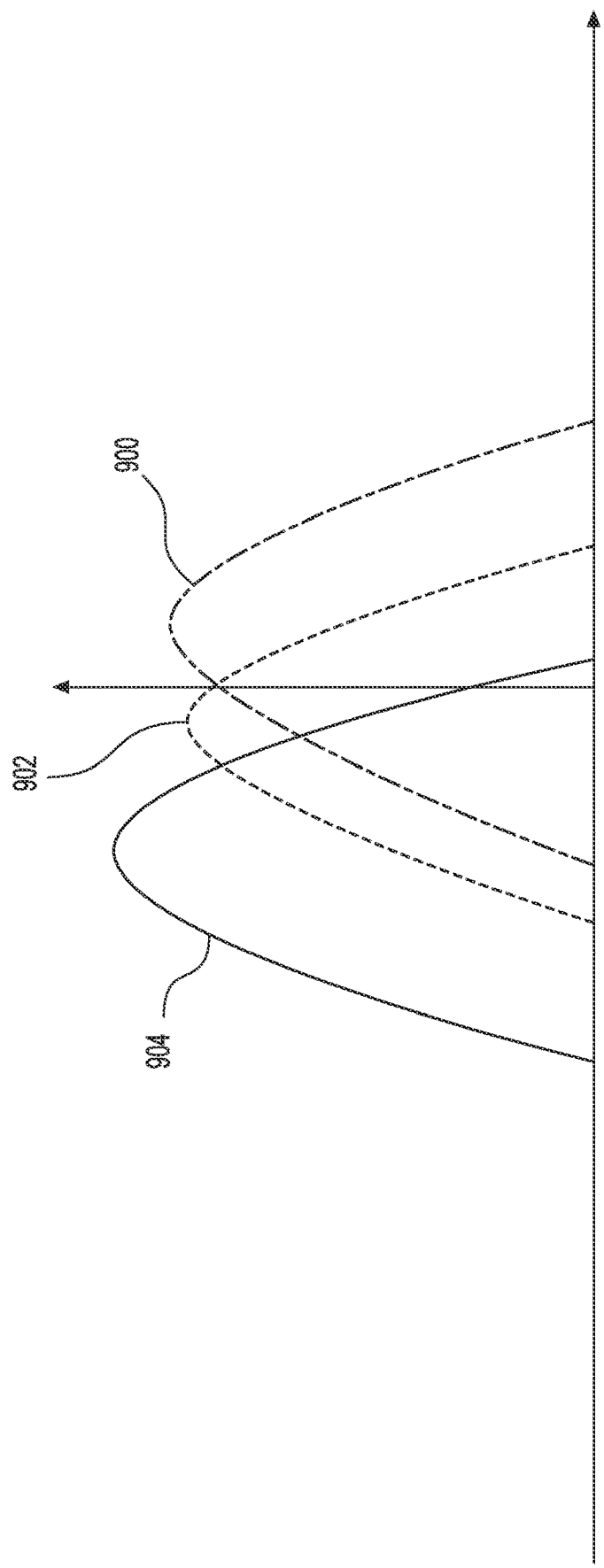
FIG. 9 depicts a threshold voltage distributions of the memory cells of two edge word lines and of the remaining word lines.

Prior to programming, all memory cells of a word line are erased in an erase operation, which includes at least one erase-verify iteration, each with an erase pulse and a verify pulse. One known problem is that the memory cells of certain word lines, specifically the edge word lines, may not fully erase as deeply as the memory cells of the other word lines. In the example shown in FIG. 6B, the edge word lines are layers WLL0 and WLL10, which are immediately adjacent to dummy word lines DWLS1 and DWLD1 respectively. In other embodiments where a memory block includes more than eleven word lines, the edge word lines could be, for example, word lines WL0 and WL111 or word lines WL0 and WL239. The shallow erase of the edge word lines may result in the Vt distributions of those memory cells having higher upper tails than the other word lines. For example, FIG. 9 depicts a Vt distribution of the memory cells of a memory block after erase with curve 900 identifying the memory cells of edge word line WLL0, curve 902 identifying the memory cells of edge word line WL239, and curve 904 identifying the memory cells of all of the other word lines (WL1 through WL238). In many cases, this effect of the edge word lines experiencing a more shallow erase than the other word lines is caused by the dielectric layers between the dummy word lines and the edge word lines being thicker than the dielectric layers between the other word lines, also by the asymmetric electric potential environment of edge word lines, as edge words are sandwiched by one data word line and one dummy word line while other data word lines are sandwiched by two data word lines. Both of the thickened dielectric layer and the asymmetric electric potential effectively lower the voltage difference between a memory cell of an edge word line and the channel through a fringing effect. This shallow erase issue may not be present in some dies due to a variation in the thicknesses of the dielectric layers across different dies. In other words, the edge word lines may not experience shallow erase in dies where the dielectric layers between the dummy word lines and the edge word lines have a similar thickness as the dielectric layers between the other word lines.

Moreover, the location of the aforementioned SHE cut between two memory holes so that those memory holes have semi-circular SGD cells can further slow down edge word line erase speeds, thereby exacerbating the shallow erase issue.

One approach to solving the shallow erase problem is to use an additional erase pulse. However, an additional erase pulse may cause some memory cells to be over erased, which may reduce the reliability of the memory device.

One erase-verify technique involves grouping all of the even word lines (WL0, WL2, WL4, . . . WL238) in a first group and grouping all of the odd word lines (WL1, WL3, WL5, . . . WL239) in a second group. The word lines of the first group are then all verified together simultaneously, and the word lines of the second group are all verified together simultaneously. However, this approach makes it difficult to capture a single word line with a shallow erase.

In a first embodiment of the present disclosure, an erase technique is provided that identifies shallow erased word lines involves putting both edge word lines (e.g., WL0 and WL239) in a single group, Group 2. In an embodiment, the even word lines (but not WL0) are in Group 1, and WL0 and the odd word lines are in Group 2. Thus, in this embodiment, Group 1 includes WL2, WL4, WL6, . . . WL238, none of which are edge word lines, and Group 2 includes WL0, WL1, WL3, . . . WL239. In comparison to the other grouping, only one word line (WL0) has been moved from Group 1 to Group 2. Thus, Group 1 and Group 2 have similar numbers of word lines. In some embodiments, specific, predetermined non-edge word lines that may also be susceptible to shallow erase may also be grouped into Group 2.

Figure 10:
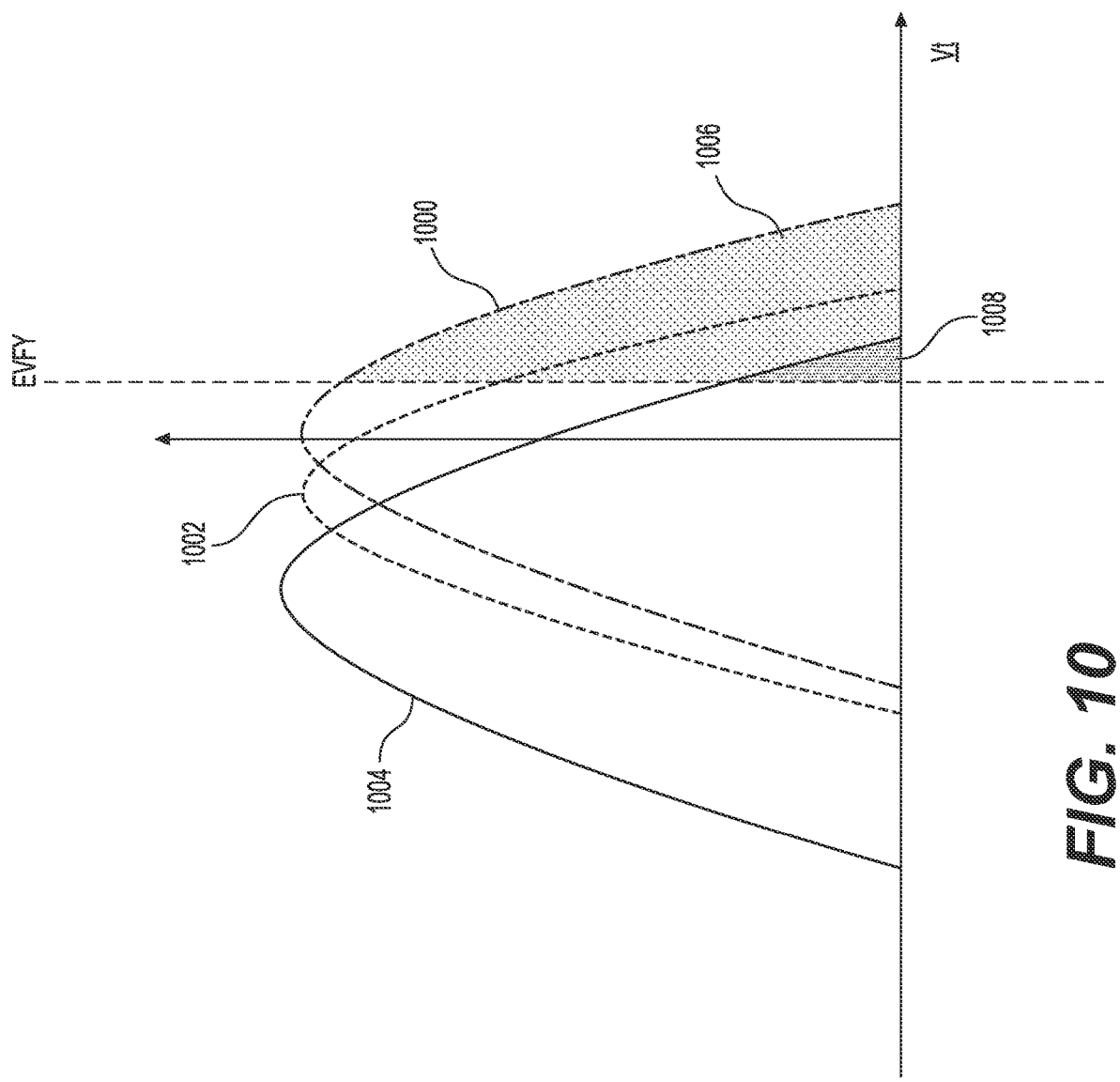
FIG. 10 depicts the threshold voltage distributions of the memory cells of two edge word lines and the remaining word lines and identifying a count of memory cells of a first group of word lines that did not pass erase-verify and a count of memory cells of a second group of memory cells that did not pass erase-verify during an erase operation.

According to this new technique, during erase-verify, the number of failing memory cells are counted for each of the two groups. That is, for each group, the number of memory cells whose threshold voltages are greater than an erase verify voltage (EVFY) are counted and designated to a variable. For example, N1 may designate the number of failing memory cells in Group 1, and N2 may designate the failing memory cells in Group 2. If the edge word lines experience a shallow erase, then because Group 2 includes both edge word lines and Group 1 includes no edge word lines, the second count N2 will be greater than the first count N1. For example, FIG. 10 depicts a plot of the Vt distribution of an example memory block where the edge word lines did experience a shallow erase. In this plot, curve 1000 identifies the Vt distribution of the memory cells of edge word line WL0, curve 1002 identifies the Vt distribution of the memory cells of edge word line WL239, and curve 1004 identifies the Vt distribution of the memory cells of all other word lines. Shaded area 1006 approximately depicts N2, and shaded area 1008 approximately depicts N1. Thus, in this example, because the edge word lines experienced shallow erase, N2 is significantly greater than N1. On the contrary, if the edge word lines did not experience a shallow erase, then N2 and N1 should be similar.

After counting the failed memory cells, N2 is subtracted from N1, and the result is compared to a predetermined threshold. In other words, it is determined if N2−N1≥Threshold. If this result (N2−N1) is less than the Threshold, then this indicates that the edge word line did not experience a shallow erase, and the erase operation is considered to have been completed so long as each of the Groups passed erase-verify. If the result (N2−N1) is greater than or equal to the Threshold, then an extra erase operation (hereinafter referred to as "slim erase") is performed on the edge word lines to reduce the threshold voltages of the memory cells of the edge word lines to align more closely with the threshold voltages of the other data word lines.

Figure 11:
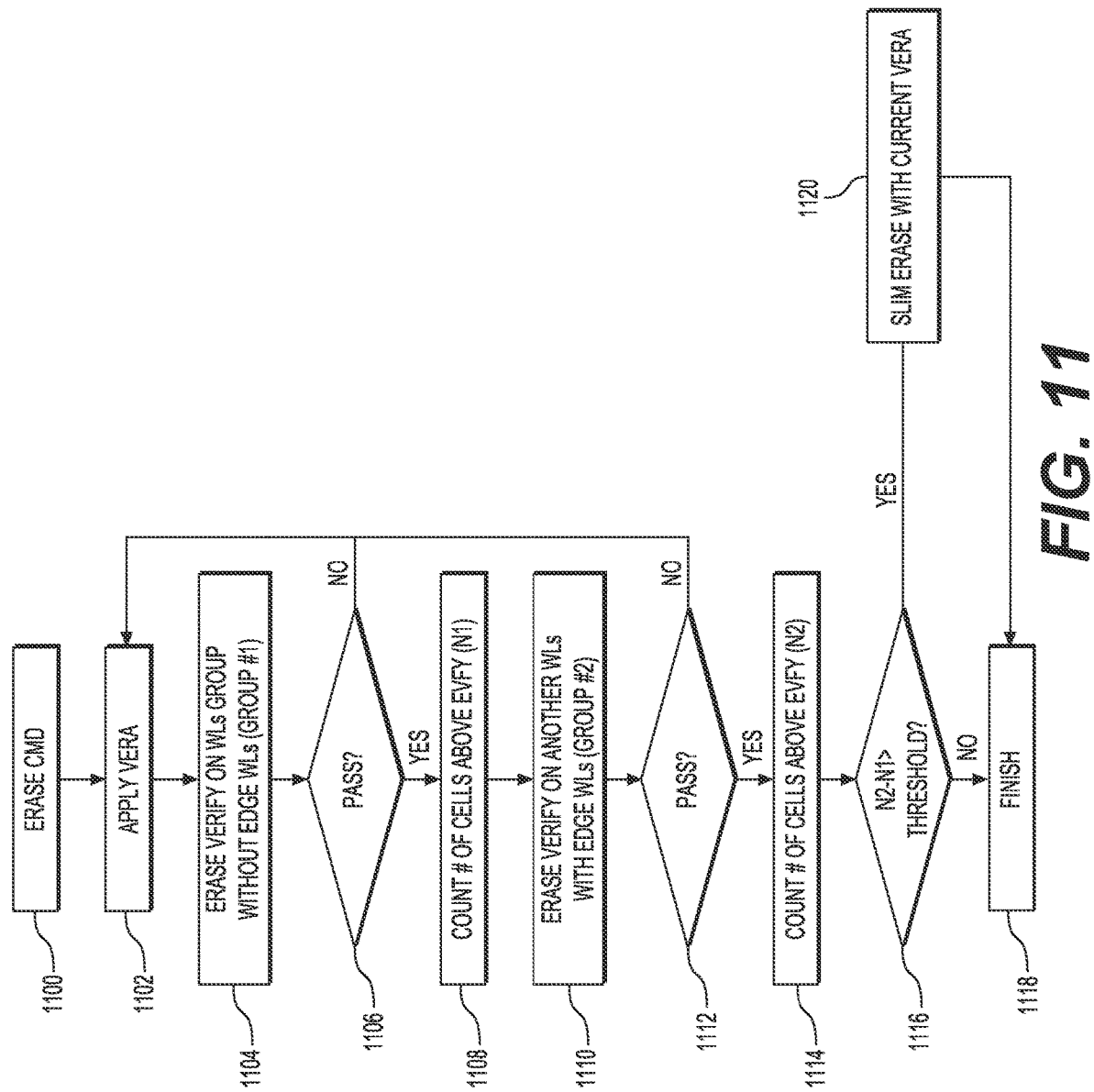
FIG. 11 is a flow chart depicting the steps of erasing a plurality of memory cells according to one exemplary embodiment of the present disclosure.

FIG. 11 is a flow chart illustrating the method steps of an exemplary embodiment of erasing the memory cells of a memory block. At step, 1100, an erase command is received. At step 1102, an erase voltage Vera is applied to erase all of the memory cells, both those in Group 1 and Group 2 (more details are discussed below with reference to FIG. 12). At step 1104, erase-verify is performed on the word lines of Group 1, i.e., the group without the edge word lines.

At decision step 1106, it is determined if the erase-verify of the Group 1 word lines passed. If the answer at decision step 1106 is no, then the method returns to step 1102.

If the answer at decision step 1106 is yes, then the method proceeds to step 1108. At step 1108, the memory cells of the Group 1 word lines that have threshold voltages above an erase verify voltage EVFY are counted to determine the first count N1. At step 1110, erase-verify is performed on the word lines of Group 2.

At decision step 1112, it is determined if the erase-verify of the Group 2 word lines passed. If the answer at decision step 1112 is no, then the method returns to step 1102.

If the answer at decision step 1112 is yes, then the method proceeds to step 1114. At step 1114, the memory cells of the Group 2 word lines that have threshold voltages above the erase verify voltage EVFY are counted to determine the second count N2.

At decision step 1116, it is determined if the difference between N2 and N1 (i.e., N2−N1) is greater than the Threshold. If the answer at decision step 1116 is no, then at step 1118, the erase operation is completed. If the answer at decision step 1116 is yes, then at step 1120, the slim erase operation is performed using the current erase voltage Vera. The method then proceeds to step 1118, and the erase operation is completed.

Figure 12:
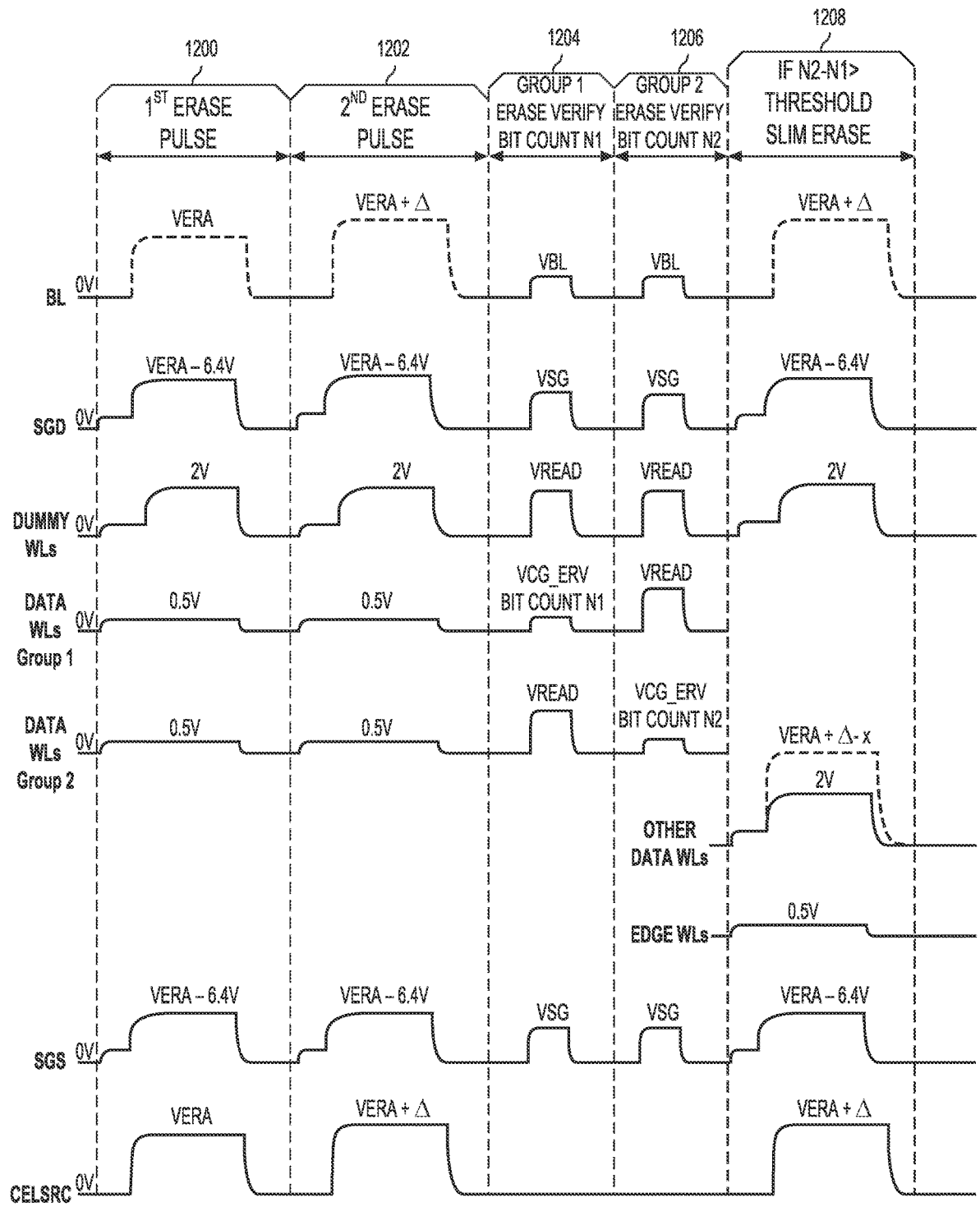
FIG. 12 illustrates the voltages applied to various components of the memory device during the erase operation depicted in FIG. 11.

FIG. 12 depicts the voltage waveforms applied to various components of the memory device during the erase and erase verify operation. Times 1200 and 1202 correspond to the step 1104 of FIG. 11; time 1204 corresponds to step 1110; time 1206 corresponds to step 1114; and time 1208 corresponds to step 1120.

The slim erase operation of time 1208 is only performed in response to the difference between N2 and N1 being greater than the Threshold (N2−N1>Threshold). During the slim erase operation, the erase voltage Vera is applied to source side CELSRC, the bit lines coupled to the Vera while SGD and SGS are applied to voltage Vera (for example, 6.4V), to make sure they are not erased, i.e., inhibit erase. A first voltage (for example, 2 V) is applied to the dummy word lines. The non-edge data word lines are inhibited to minimize further erase of the memory cells in the non-edge word lines. In this embodiment, to inhibit the non-edge word lines, the non-edge word lines are electrically floated such that their channel to gate potential are near 0 V or the first voltage is applied to the control gates of the non-edge word lines to minimize the gate to channel potential difference. The edge word lines are held at a very low voltage (for example, 0.5 V) to further erase the memory cells of the edge word lines.

Figure 13:
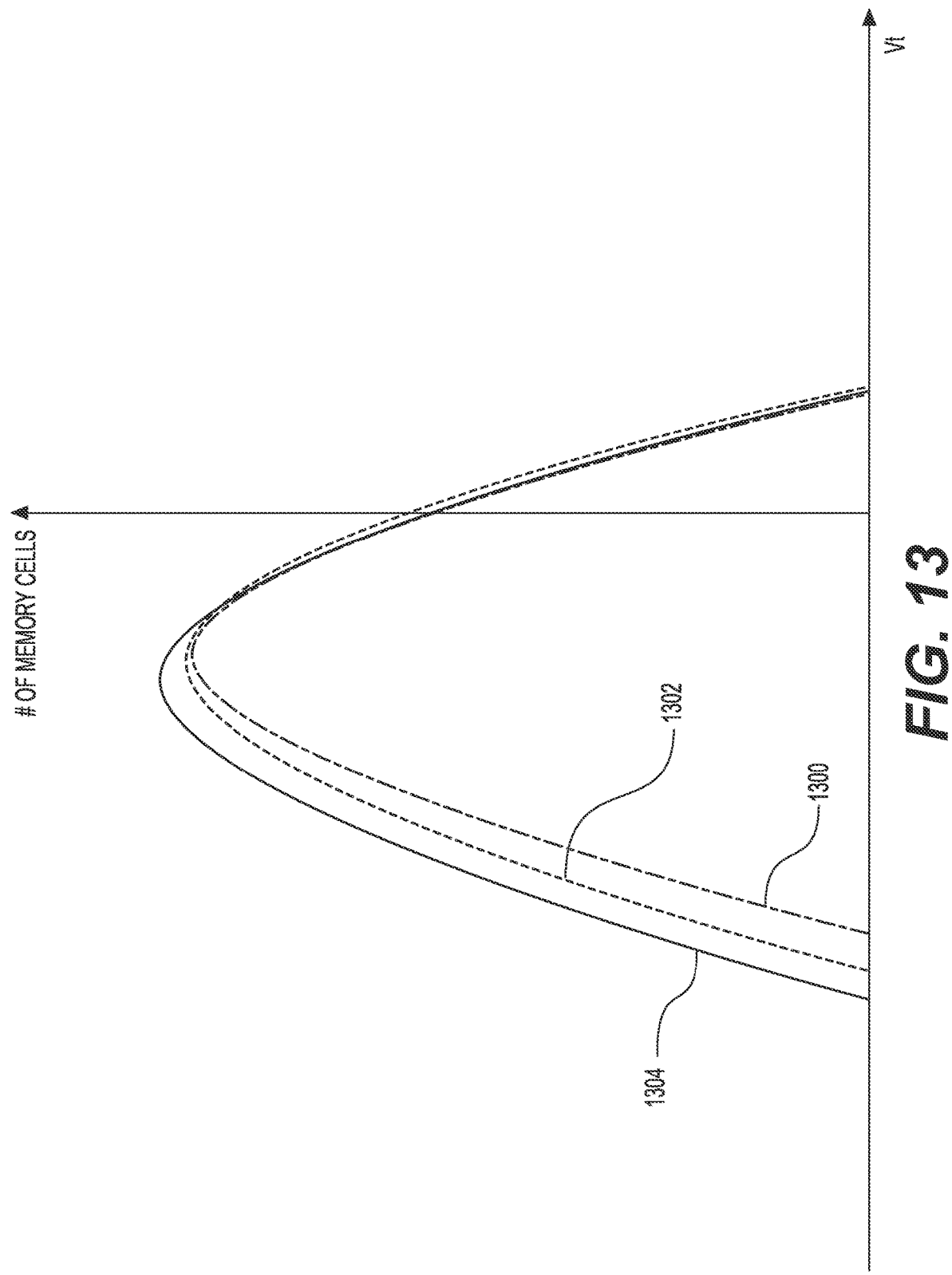
FIG. 13 depicts the threshold voltage distributions of the memory cells of two edge word lines and the remaining word lines after the erase operation depicted in FIG. 11 is completed.

With this technique of detecting shallow erase in the edge word lines and then performing the slim erase operation only on the memory cells of the edge word lines, an improved erase voltage distribution can be accomplished. For example, FIG. 13 depicts a voltage distribution of the memory cells of edge word line WL0 (curve 1300), edge word line WL239 (curve 1302), and all other word lines (curve 1304). As shown, the upper tails curves 1300 and 1302 have been reduced as compared to curves 900 and 902 of FIG. 9 without over-erasing any of the memory cells.

Another example embodiment of the present disclosure provides another erase technique to correct the above-described shallow erase issue in edge word lines. In this embodiment, all of the word lines that are slow to erase (for example, the edge word lines and other word lines found to have shallow erase issues) are grouped together in Group 2, and the normal word lines (the word lines without shallow erase issues) are grouped together in Group 1. Thus, in this embodiment, Group 1 may have significantly more word lines than Group 2. As discussed in further detail below, according to this erase technique, a normal erase-verify operation is performed on the memory cells of both the Groups 1 and 2 word lines until the memory cells of the Group 1 word lines pass the verify voltage EVFY (i.e., have threshold voltages that are less than EVFY). Next, if the word lines of Group 2 have not passed the verify voltage EVFY, the erase-verify operation is performed only on the Group 2 word lines. The Group 1 word lines are either floated or a high bias is applied to the Group 1 word lines to inhibit further erase on the Group 1 word lines until the memory cells of the Group 2 word lines pass erase-verify.

Figure 14:
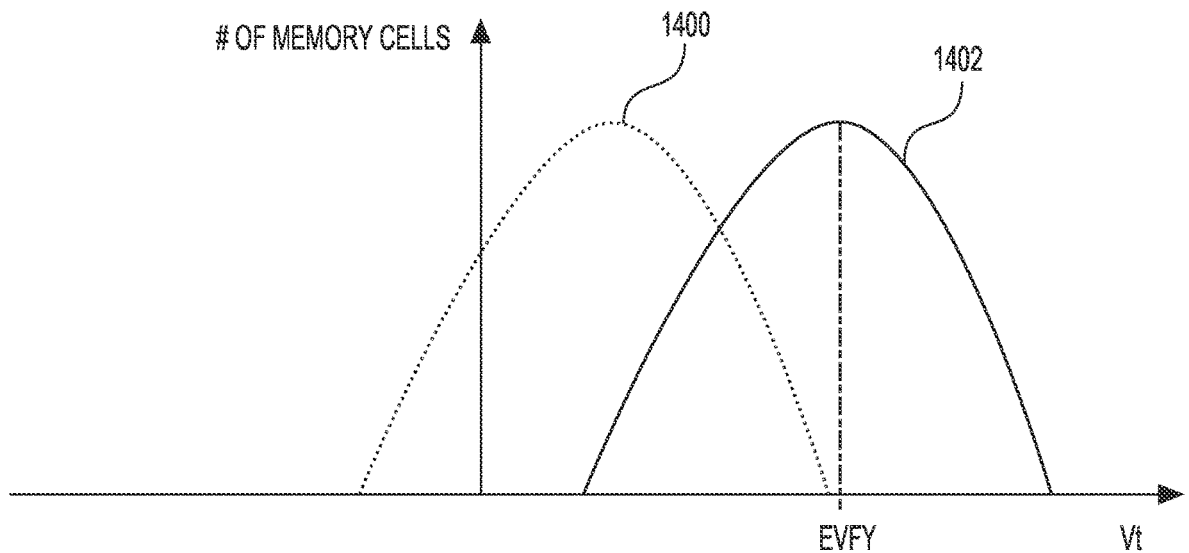
FIG. 14 depicts the threshold voltages of the memory cells of two groups of word lines after a first portion of an erase operation according to an alternate embodiment is completed.
Figure 15:
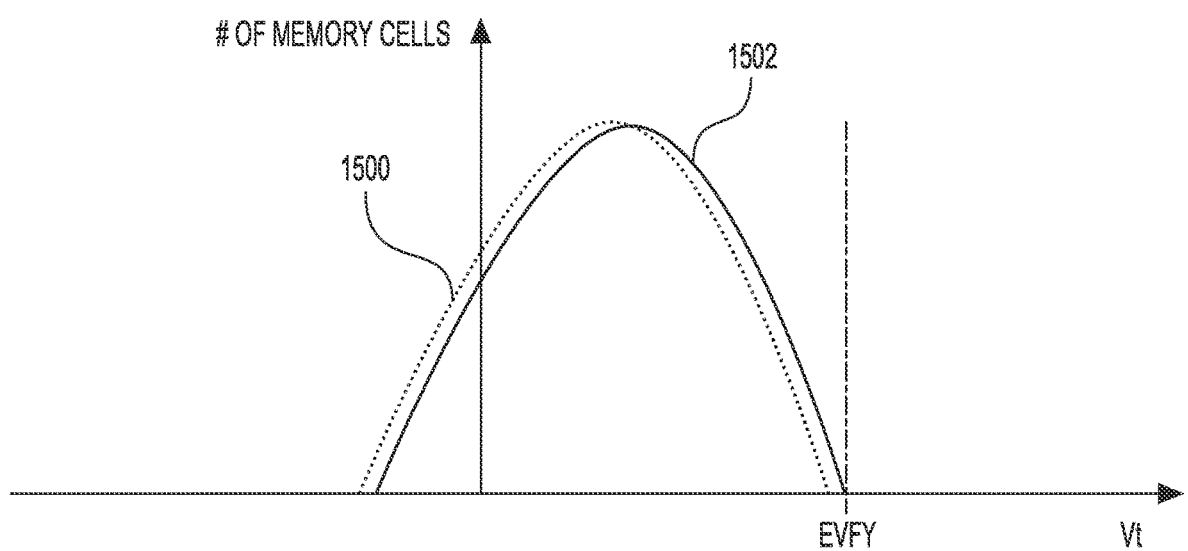
FIG. 15 depicts the threshold voltages of the memory cells of the two groups of word lines after a second portion of the erase operation according to the alternate embodiment is completed.

FIG. 14 illustrates the threshold voltage distribution of a memory block after erase-verify of the Group 1 word lines is completed with curve 1400 identifying the voltage distribution of the memory cells of the Group 1 word lines and curve 1402 identifying the voltage distribution of the memory cells of the Group 2 word lines. As shown, at this point during the erase operation, on average, the memory cells of Group 2 have greater threshold voltages than the memory cells of Group 1 with many of the memory cells of Group 2 having threshold voltages that are significantly greater than the erase verify voltage EVFY. Turning now to FIG. 15, after the extra erase and erase-verify operations are performed on the Group 2 memory cells, the threshold voltage distributions of Groups 1 and 2 are similar as indicated by curves 1500 and 1502.

Figure 16:
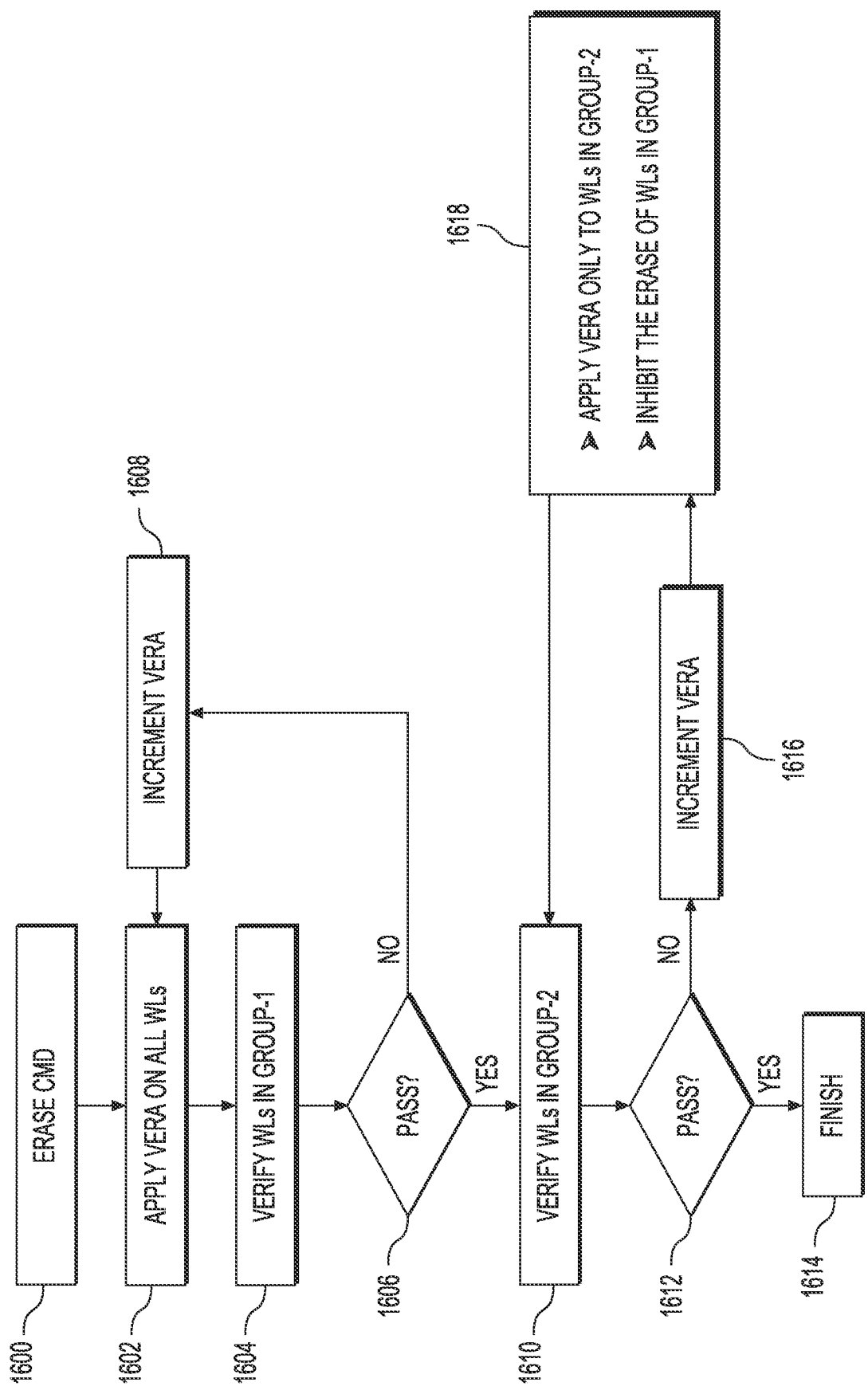
FIG. 16 is a flow chart depicting the steps of erasing a plurality of memory cells according to the alternate embodiment of the present disclosure.

FIG. 16 is a flow chart illustrating the method steps of another exemplary embodiment of erasing the memory cells of a memory block. At step 1600, an erase command is received. At step 1602, an erase voltage Vera is applied to the control gates coupled to all word lines, including both the word lines of Group 1 and the word lines of Group 2. The erase voltage Vera may be applied to all word lines simultaneously or it may first be applied to either the even word lines or the odd word lines and then to the other of the even and odd word lines. At step 1604, an erase-verify operation is performed on the memory cells of the Group 1 word lines.

At decision step 1606, it is determined if the verify of the memory cells of the Group 1 word lines has passed. If the answer at decision step 1606 is no, then at step 1608, the erase voltage Vera is incrementally increased (Vera=Vera+dVera). The method then returns to step 1602. If the answer at decision step 1606 is yes, then at step 1610, an erase-verify operation is performed on the memory cells of the word lines of Group 2.

Following step 1610 is decision step 1612, where it is determined if the erase-verify operation of the memory cells of the Group 2 word lines passed. If the answer at step 1612 is yes, then at step 1614 the erase operation is completed.

If the answer at step 1612 is no, then at step 1616, the erase voltage Vera is incrementally increased (Vera=Vera+dVera). At step 1618, the erase voltage Vera is applied to only the control gates coupled to the word lines of Group 2. During the application of the erase voltage Vera, the word lines of Group 1 are inhibited form erase by either floating the word lines in Group 1 or by applying a higher bias, which may be dependent on the number of erase loops that have been conducted, on the word lines of Group 1.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A memory apparatus, comprising:
   a memory block including a plurality of memory cells arranged in a plurality of word lines, the plurality of word lines including at least one edge word line; and
   a controller in communication with the plurality of memory cells, the controller being configured to:
   group the word lines into a first group that does not include the at least one edge word line and a second group that includes the at least one edge word line,
   perform an erase operation on the memory cells of the first and second groups until erase-verify of the memory cells of the first group passes,
   determine whether further erase of the memory cells of the second group is necessary, wherein, to determine whether further erase of the memory cells of the second group is necessary, the controller is further configured to (i) determine a first count of a number of the memory cells of the first group that have threshold voltages above an erase verify voltage and (ii) determine a second count that is a number of memory cells of the second group that have threshold voltages above the erase verify voltage,
   compare a difference between the first count and the second count to a predetermined threshold, and
   in response to the difference being greater than the predetermined threshold, perform an additional erase operation on at least one word line of the second group.

2. The memory apparatus as set forth in claim 1, wherein the memory block includes at least one stack with at least one SGD and at least one SGS,
   wherein the plurality of word lines includes at least one dummy word line and a plurality of data word lines, and
   wherein the at least one edge word line is at least one of the plurality of data word lines that is adjacent at least one dummy word line.

3. The memory apparatus as set forth in claim 2, wherein at least one SHE trench extends through a portion of the memory block such that at least one SGD or at least one SGS is semi-circular in shape.

4. The memory apparatus as set forth in claim 3, wherein the first group of word lines does not include any edge word lines of the memory block and wherein the second group of word lines includes all edge word lines.

5. The memory apparatus as set forth in claim 3, wherein during the additional erase operation, the controller is configured to inhibit at least one word line from further erase.

6. The memory apparatus as set forth in claim 1, wherein the at least one word line that the additional erase operation is conducted on includes only edge word line(s).

7. The memory apparatus as set forth in claim 3, wherein the additional erase operation includes at least one erase-verify iteration that includes an erase pulse that is applied to a control gate of at least one word line of the second group and at least one verify pulse.

8. The memory apparatus as set forth in claim 7, wherein the at least one erase-verify iteration includes multiple erase-verify iterations and wherein the controller is configured to incrementally increase a voltage of the erase pulse between erase-verify iterations.

9. A method of erasing a plurality of memory cells in a memory device, the method comprising the steps of:
- preparing a memory block including a plurality of memory cells arranged in a plurality of word lines, the plurality of word lines including at least one edge word line;
- grouping the word lines into a first group that does not include the at least one edge word line and a second group that includes the at least one edge word line;
- performing an erase operation on the memory cells of the first and second groups until erase-verify of the memory cells of the first group passes;
- determining whether further erase of the memory cells of the second group is necessary by (i) determining a first count of a number of the memory cells of the first group that have threshold voltages above an erase verify voltage and (ii) determining a second count that is a number of memory cells of the second group that have threshold voltages above the erase verify voltage;
- comparing a difference between the first count and the second count to a predetermined threshold; and
- in response to the difference being greater than the predetermined threshold, performing an additional erase operation on at least one word line of the second group.

10. The method as set forth in claim 9 wherein the memory block includes at least one stack with at least one SGD and at least one SGS,
- the plurality of word lines includes at least one dummy word line and a plurality of data word lines, and
- the at least one edge word line is at least one of the plurality of data word lines that is adjacent at least one dummy word line.

11. The method as set forth in claim 10 wherein at least one SHE trench extends through a portion of the memory block such that at least one SGD or at least one SGS is semi-circular in shape.

12. The method as set forth in claim 11, wherein the first group of word lines does not include any edge word lines of the memory block and wherein the second group of word lines includes all of the edge word lines.

13. The method as set forth in claim 11, wherein during the additional erase operation, the method further includes the step of inhibiting at least one word line from further erase.

14. The method as set forth in claim 9 wherein the at least one word line that the additional erase operation is conducted on includes only edge word line(s).

15. The method as set forth in claim 11 wherein the additional erase operation includes at least one erase-verify iteration that includes an erase pulse that is applied to a control gate of at least one word line of the second group and at least one verify pulse.

16. The method as set forth in claim 15 wherein the at least one erase-verify iteration includes multiple erase-verify iterations and wherein a voltage of the erase pulse is increased between erase-verify iterations.

17. An apparatus, comprising:
- a memory block including a plurality of memory cells arranged in a plurality of word lines, the plurality of word lines including at least one edge word line; and
- an erasing means in communication with the plurality of memory cells for erasing the plurality of memory cells, the erasing means being configured to:
  - group the word lines into a first group that does not include the at least one edge word line and a second group that includes the at least one edge word line,
  - perform an erase operation on the memory cells of the first and second groups until erase-verify of the memory cells of the first group passes,
  - determine whether further erase of the memory cells of the second group is necessary, wherein, to determine whether further erase of the memory cells of the second group is necessary, the erasing means is further configured to (i) determine a first count of a number of the memory cells of the first group that have threshold voltages above an erase verify voltage and (ii) determine a second count that is a number of memory cells of the second group that have threshold voltages above the erase verify voltage,
  - compare a difference between the first count and the second count to a predetermined threshold, and
  - in response to the difference being greater than the predetermined threshold, perform an additional erase operation on at least one word line of the second group.

18. The apparatus as set forth in claim 17, wherein at least one SHE trench extends through a portion of the memory block such that at least one SGD or at least one SGS is semi-circular in shape.

* * * * *